United States Patent [19]

Yokoi

[11] Patent Number: 5,566,080
[45] Date of Patent: Oct. 15, 1996

[54] METHOD AND APPARATUS FOR DESIGNING SEMICONDUCTOR DEVICE

[75] Inventor: Atsushi Yokoi, Kasugai, Japan

[73] Assignee: Fujitsu Limited, Kawasaki, Japan

[21] Appl. No.: 297,101

[22] Filed: Aug. 29, 1994

[30] Foreign Application Priority Data

Sep. 7, 1993 [JP] Japan .................................. 5-221898

[51] Int. Cl.⁶ .................................................. G06F 17/50
[52] U.S. Cl. .......................... 364/491; 364/488; 364/489; 364/490
[58] Field of Search .................................... 364/489, 488, 364/490, 491, 578, 200; 357/40

[56] References Cited

U.S. PATENT DOCUMENTS

| | | | |
|---|---|---|---|
| 4,613,940 | 9/1986 | Shenton et al. | 364/490 |
| 4,652,992 | 3/1987 | Mensch, Jr. | 364/200 |
| 4,783,749 | 11/1988 | Duzy et al. | 364/491 |
| 4,949,275 | 8/1990 | Nonaka | 364/490 |
| 5,119,158 | 6/1992 | Hatano | 357/40 |
| 5,126,950 | 6/1992 | Rees et al. | 364/490 |
| 5,150,309 | 9/1992 | Shaw et al. | 364/491 |
| 5,247,456 | 9/1993 | Ohe et al. | 364/491 |
| 5,365,454 | 11/1994 | Nakagawa et al. | 364/491 |
| 5,377,124 | 12/1994 | Mohsen | 364/489 |

OTHER PUBLICATIONS

"A Technology–Independent Approach to Custom Analog Cell Generation", by S. Mehranfar, IEEE Journal of Solid-State Circuits, vol. 26, No. 3, Mar. 1991, pp. 386–393.

"Automatic Generation of Symbolic Cells from a Net–List Descriptions", by Costa et al., IEEE, CH2704–May 1989, pp. 5-35 5-39.

"iCoach: A Circuit Optimization Aid for CMOS High–Performance Circuits", by H. Chen and S. Kang, IEEE, CH2657–May 1988, pp. 372–375.

*Primary Examiner*—Kevin J. Teska
*Assistant Examiner*—Russell W. Frejd
*Attorney, Agent, or Firm*—Armstrong, Westerman, Hattori, McLeland & Naughton

[57] ABSTRACT

Disclosed is a method of designing a semiconductor device including a plurality of elements, using a computer-aided design (CAD) apparatus. Data about the basic design of each cell is stored as a cell in a library of the CAD apparatus. In each cell, a plurality of connecting terminal regions for connecting an associated element to an external interconnection are provided as electrically disconnected from an internal circuit forming area of this element. This cell is laid at a desired position in a semiconductor device that is being designed. After the necessary cells are laid out, one of the connecting terminals is selected for each cell from a plurality of connecting terminal regions. Then, an interconnection for connecting the internal circuit forming area to the selected connecting terminal region is designed.

7 Claims, 8 Drawing Sheets

METHOD AND APPARATUS FOR DESIGNING SEMICONDUCTOR DEVICE

BACKGROUND OF THE INVENTION

1. Field of the Invention

The present invention relates generally to a method of designing semiconductor devices, an apparatus for designing semiconductor devices, and a semiconductor device designed by this method. More particularly, this invention relates to efficient designing of the interconnection for cells laid out on a chip that reduces interconnection resistance and capacitance.

2. Description of the Related Art

Recent advances in computer-aided design (CAD) allow semiconductor devices to be designed using a CAD apparatus which is equipped with a library that stores data on various kinds of cells. In the field of designing semiconductor devices, "cell" represents one unit having function as a single electric element, which is typified by an invertor or a two-input NAND gate, and exists in a CAD apparatus in data form, such as pattern data, connection data, electrical characteristic data and a truth-table.

In designing a logic circuit, desired cells are selected from a cell data library prepared in advance. The pattern of each selected cell is displayed on the screen (display) of a CAD apparatus is based on pattern data. The screen of the CAD apparatus displays the layout of a semiconductor chip, and an operator lays the cell pattern at the desired position in the chip layout. After completion of the layout of all the cells needed for the logic circuit, the interconnections between terminals of the individual cells are automatically made in automatic interconnection mode to complete the designing of the semiconductor chip.

Figure 1:
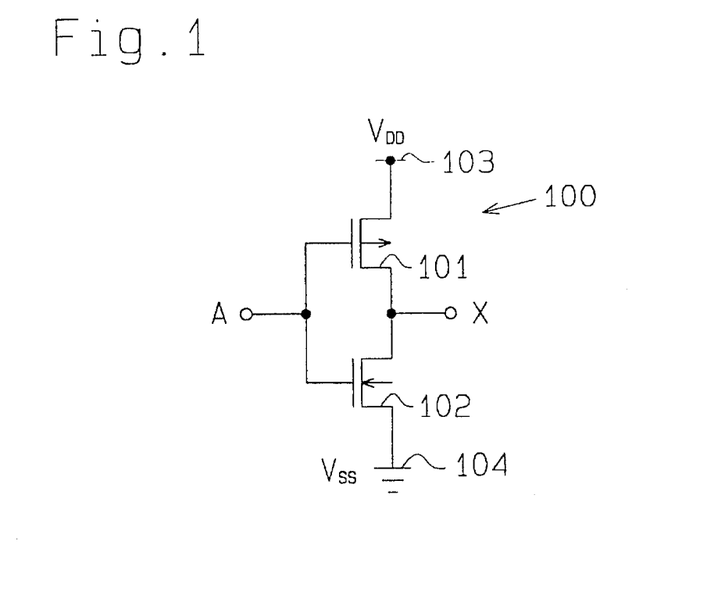
FIG. 1 is a circuit diagram of an invertor which is a part of a logic circuit to be designed.

FIG. 1 shows a part of a logic circuit that is to be designed. An invertor 100 has a CMOS structure constituted by a PMOS transistor 101 and an NMOS transistor 102. The transistors 101 and 102 have gates connected to an input terminal A, and have drains connected to an output terminal X. The transistor 101 has a source connected to a power line 103 of a high-potential power source $V_{DD}$. The transistor 102 has a source connected to a power line 104 of a low-potential power source $V_{SS}$.

When data of a cell 110 corresponding to this invertor 100 is read from a cell library, a pattern PA of this cell 110 is displayed on a display based on the cell data. An operator lays the pattern PA at the desired position in the chip layout.

Figure 2:
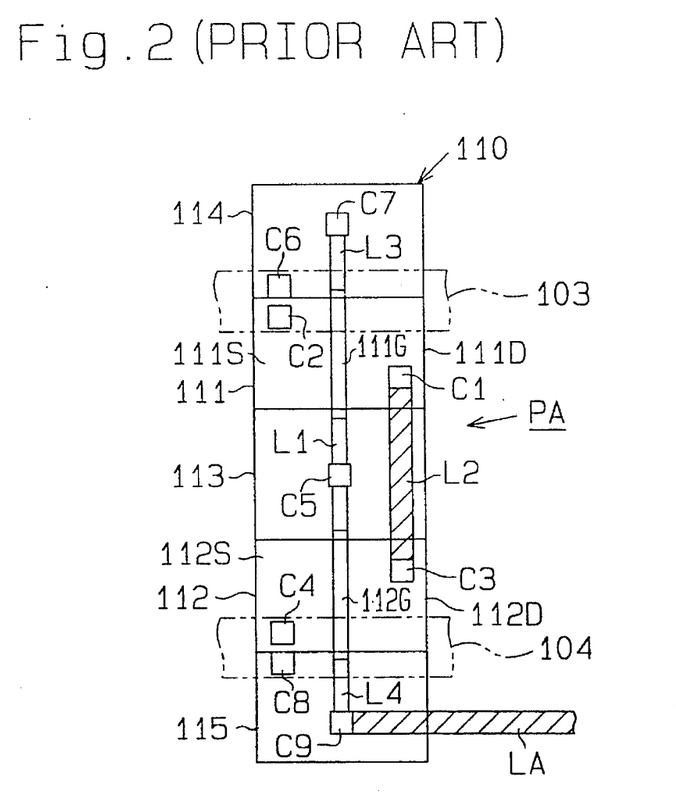
FIG. 2 is a layout diagram for a conventional invertor cell.

The layout of the cell 110 is illustrated in FIG. 2. The pattern PA of the cell 110 includes the first and second transistor forming areas 111 and 112, and first, second and third interconnection forming areas 113 to 115. The first interconnection forming area 113 is located between the transistor forming areas 111 and 112.

The first transistor forming area 111 is defined by the cell data as an area where the transistor 101 is to be formed. The first transistor forming area 111 includes a region 111D where a drain is formed, a region 111G where a gate is formed and a region 111S where a source is formed. Defined in the drain region 111D is a region C1 where a contact hole to connect to a signal line is formed. Defined in the source region 111S is a region C2 where a contact hole to connect to the power line 103 is formed.

The second transistor forming area 112 is defined by the cell data as an area where the transistor 102 is to be formed. The second transistor forming area 112 includes a region 112D where a drain is formed, a region 112G where a gate is formed and a region 112S where a source is formed. Defined in the drain region 112D is a contact region C3 where a contact hole to connect to a signal line is formed. Defined in the source region 112S is a contact region C4 where a contact hole to connect to the power line 104 is formed.

The first interconnection forming area 113 is defined as an area where a signal line is to be laid out. The first interconnection forming area 113 has an interconnection region L1 for connecting both gate regions 111G and 112G of the transistor forming areas 111 and 112 by a polysilicon wire, and an interconnection region L2 for connecting the drain regions 111D and 112D by an aluminum wire. Defined on the interconnection region L1 is a contact region C5 where a contact hole to connect to a signal line is formed.

The second interconnection forming area 114 is defined as an area where a signal line is to be laid out. The second interconnection forming area 114 has an interconnection region L3 for connecting the gate region 111G of the first transistor forming area 111 to a signal line by a polysilicon wire, and a contact region C6 where a contact hole to connect to the power line is formed. Defined on the interconnection region L3 is a contact region C7 where a contact hole to connect to a signal line is formed.

The third interconnection forming area 115 is defined as an area where a signal line is to be laid out. The third interconnection forming area 115 has an interconnection region L4 for connecting the gate region 112G of the second transistor forming area 112 to a signal line by a polysilicon wire, and a contact region C8 where a contact hole to connect to the power line is formed. Defined on the interconnection region L4 is a contact region C9 where a contact hole to connect to a signal line is formed.

The individual contact regions C5, C7 and C9, and the individual interconnection regions L1, L3 and L4 are provided to improve the interconnecting efficiency (the number of wires per unit area) in the automatic interconnecting process. The individual contact regions C5, C7 and C9 are recognized as interconnection points (i.e., input terminal A) in automatic interconnection mode, and provide nodes at which the gates of the transistors 101 and 102 are connected to the signal lines. Even if the signal lines cannot be laid out on the first interconnection forming area 113, the contact region C7 or C9 allows a signal line to be laid on either the second interconnection forming area 114 or the third interconnection forming area 115, so that each gate can be connected to the signal line via the contact region C7 or C9. Likewise, the contact regions C1 and C3 are recognized as interconnection points (i.e., output terminal X) in automatic interconnection mode and contribute to improving the interconnecting efficiency.

If the contact region C9 is selected as the input terminal A for an aluminum signal line LA as shown in FIG. 2, for example, this signal line LA is coupled via the contact region C9 to the polysilicon interconnection formed in the interconnection region L4. When a semiconductor device is actually fabricated based on this interconnection plan, another polysilicon interconnection formed in the interconnection region L3 remains as a wasteful and redundant interconnection in the semiconductor device.

If the contact region C5 is selected as the input terminal A for an aluminum signal line, this signal line is coupled via the contact region C5 to the polysilicon interconnection formed in the interconnection region L1. When a semiconductor device is actually fabricated based on this interconnection plan, polysilicon interconnections formed in the interconnection regions L3 and L4 remain as wasteful redundant interconnections.

Those redundant interconnections impart undesirable extra resistance and capacitance to the signal lines. The extra resistance and capacitance degrade the operational characteristics of the transistors 101 and 102 in the form of operational delays.

Figure 3:
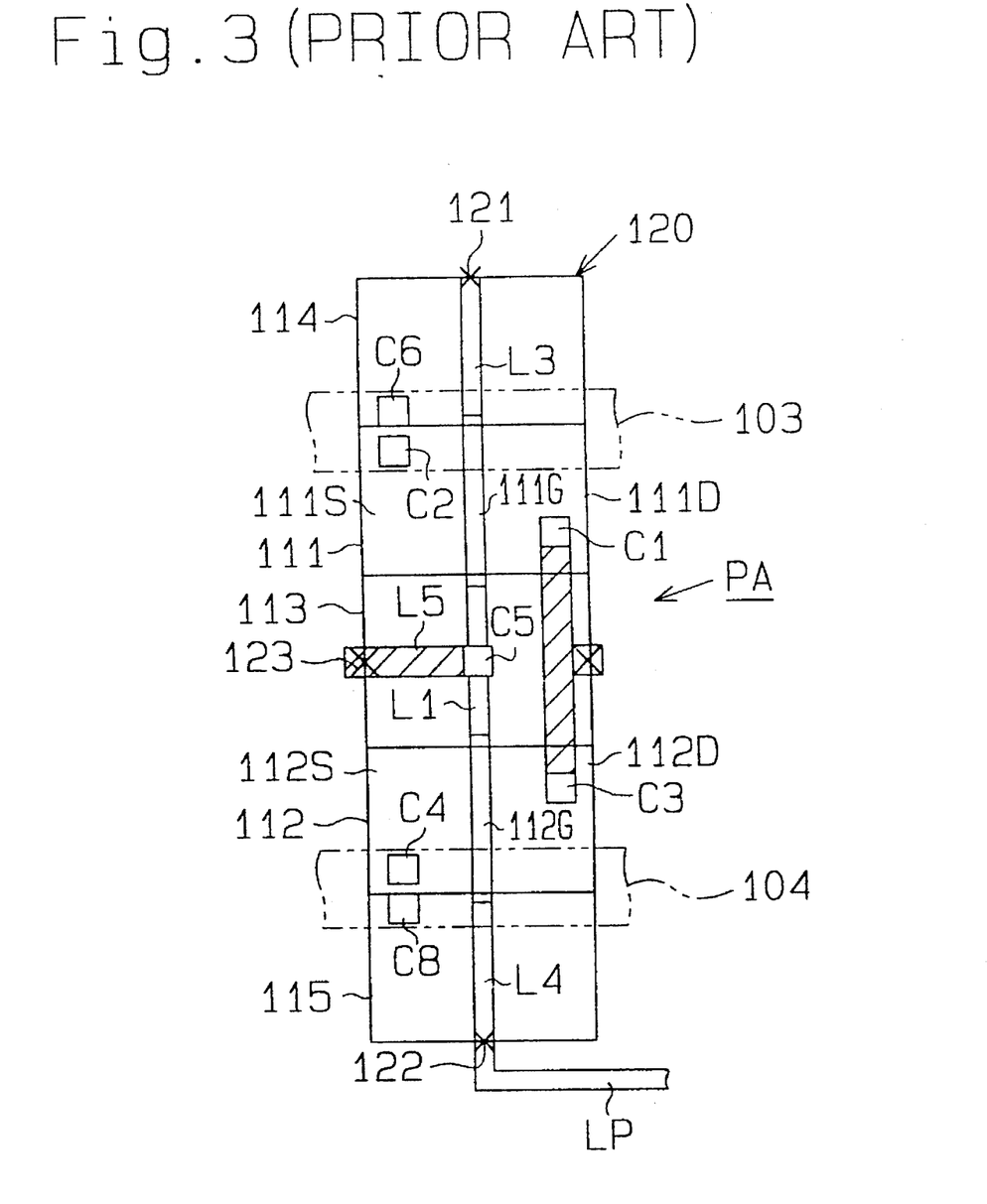
FIG. 3 is a layout diagram for another conventional invertor cell.

FIG. 3 shows the pattern PA of another invertor cell 120. In the pattern PA of the cell 120, unlike that of the cell shown in FIG. 2, the second and third interconnection forming areas 114 and 115 do not have the contact regions C7 and C9. Further, the interconnection regions L3 and L4 of the second and third interconnection forming areas 114 and 115 extend to respective nodes 121 and 122. Furthermore, a new interconnection region L5 for an aluminum interconnection extending to a center node 123 from the contact region C5 is defined in the first interconnection forming area 113. In other words, the interconnection region L5 is provided when the signal line is an aluminum interconnection. When the signal line is a polysilicon interconnection, either the interconnection region L3 or L4 is provided.

If the node 122 is selected as the input terminal A for a signal line made of polysilicon LP as shown in FIG. 3, this signal line LP is connected via the node 122 to a polysilicon interconnection formed in the interconnection region L4. When a semiconductor device is actually fabricated based on this interconnection plan, an aluminum interconnection formed in the interconnection region L5 and a polysilicon interconnection formed in the interconnection region L3 remain as wasteful interconnections and become redundant interconnections. When the node 123 (interconnection region L5) is selected for an aluminum signal line, polysilicon interconnections formed in the interconnection regions L3 and L4 remain as unnecessary interconnections in the semiconductor device and become redundant interconnections.

SUMMARY OF THE INVENTION

Accordingly, the primary objective of the present invention is to provide a design method capable of designing a semiconductor device with high interconnecting efficiency by reducing redundant interconnections in the designed semiconductor device.

Another objective of the present invention is to provide an apparatus which executes the design method embodying this invention. The design method and apparatus for semiconductor devices according to this invention can further improve the high integration of semiconductor devices and increase the operation speed thereof.

To achieve the foregoing and other objectives and in accordance with the present invention, an improved method is provided for designing a semiconductor device that includes a plurality of electric elements using a CAD apparatus.

According to this invention, plural pieces of data about the basic designs of various elements are stored as cells in a library of a CAD apparatus. In each cell, a plurality of connecting terminal regions for connecting an associated circuit element to external connections are defined as electrically disconnected from an internal circuit forming area of this circuit element. This cell is laid at the desired position in a semiconductor device being designed. After the necessary cells (a plurality of cells) are laid out, one terminal region is selected from the connecting terminal regions for each cell. Then, interconnection for connecting the internal circuit forming area to the selected connecting terminal region is designed.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings.

FIGS. 4 through 9 illustrate a first embodiment of the present invention.

FIGS. 10 and 11 illustrate a second embodiment of this invention.

FIGS. 12 and 13 illustrate a third embodiment of this invention.

FIGS. 14 and 15 illustrate a fourth embodiment of this invention.

DETAILED DESCRIPTION OF THE PREFERRED EMBODIMENTS

First Embodiment

A first embodiment of the present invention as adapted for an MOSIC design apparatus will be described with reference to FIGS. 4 through 9. FIG. 5 shows the system structure of a CAD apparatus which is a semiconductor device design apparatus. The CAD apparatus includes a central processing unit (CPU) 201, a memory 202, an input device 203, a printer 204 and a display 205. The individual components 201 to 205 are mutually connected by a system bus 206.

The CPU 201 operates on a semiconductor device designing program stored in the memory 202. The designing program includes a well-known automatic interconnection mode routine which automatically generates interconnections between circuit elements laid out on the semiconductor chip being designed. The memory 202 further stores various kinds of data necessary to execute the program, and temporarily stores the results of the processing performed by the CPU 201. A cell library is stored in the memory 202. The cell library is loaded via the bus 206 into the memory 202 from an external recording medium (not shown) such as an optical disk. The cell library contains data about various kinds of cells.

The input device 203 is equipped with a keyboard and a mouse (neither shown). Based on an operation by an operator, the input device 203 sends a command to read desired cell data from the cell library, stored in the memory 202, to the CPU 201. In response to an instruction to the CPU 201 from the input device 203, the printer 204 and display 205 receives output the results of the processing done by the CPU 201.

Figure 4:
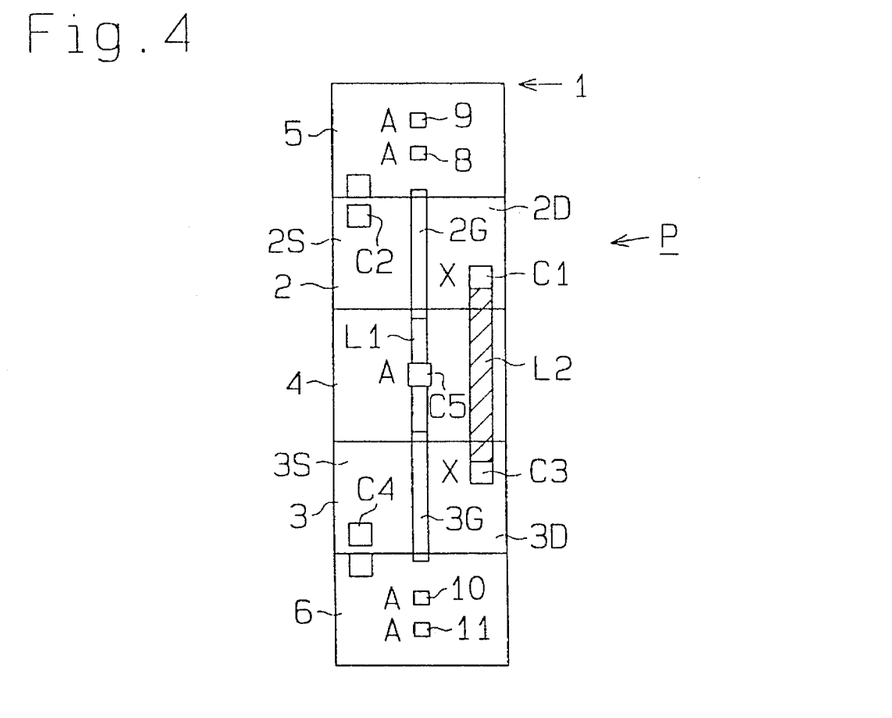
FIG. 4 is a layout diagram for an invertor cell.
Figure 5:
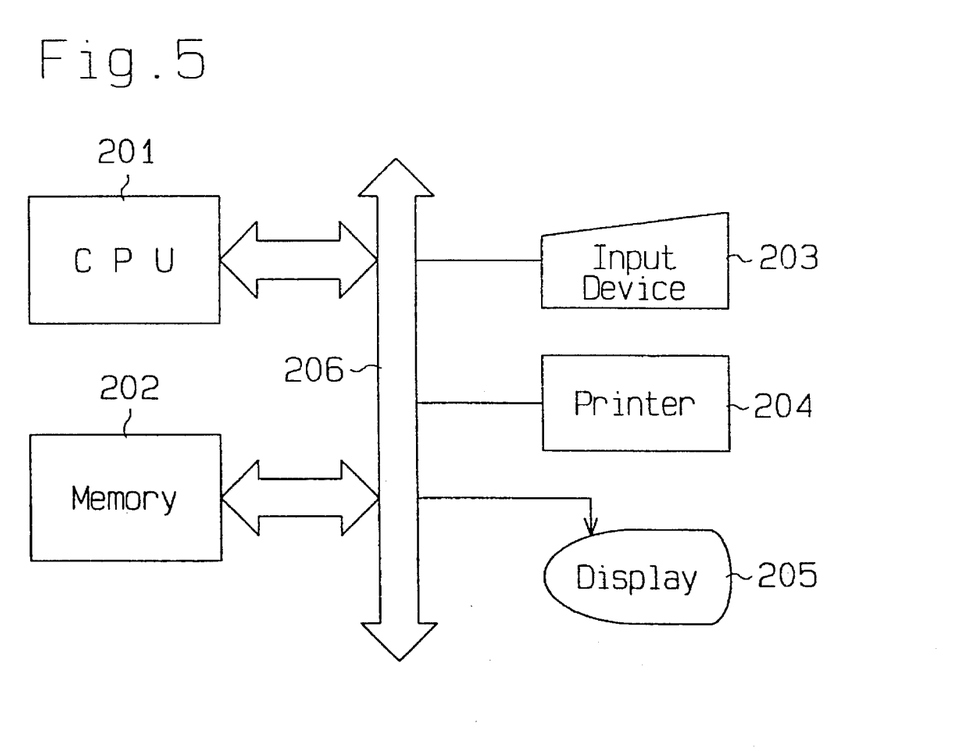
FIG. 5 is a schematic diagram showing the system structure of a CAD apparatus.

FIG. 4 shows the layout pattern, P, of an invertor cell 1 stored in the cell library. The equivalent circuit of the invertor cell 1 is the same as that of the invertor 100 shown in FIG. 1. The cell pattern P reflects cell data in the cell library in the memory 202 and is displayed on the display 205. In accordance with a request from the operator, the pattern P is laid out at the desired position on the display screen (i.e., the desired position on the semiconductor chip being designed). The pattern P includes first and second transistor forming areas 2 and 3, and first to third interconnection forming areas 4 to 6. The transistor forming areas 2 and 3 sandwich the first interconnection forming area 4. The first transistor forming area 2 is defined by the cell data as an area where the PMOS transistor 101 is to be formed. The first transistor forming area 2 has three regions defined therein: a region 2D where a drain is formed, a region 2G where a gate made of polysilicon is formed and a region 2S where a source is formed. Defined in the drain region 2D is a contact region C1 where a contact hole is formed for connection to a signal line that connects the invertor to other circuit elements. This contact region C1 is recognized as an interconnection point (i.e., output terminal X) in automatic interconnection by the design apparatus. Defined in the source region 2S is a contact region C2 for forming a contact hole. The power line 103 is to be connected to this contact region C2.

The second transistor forming area 3 is defined by the cell data where the NMOS transistor 102 is to be formed. The second transistor forming area 3 has three regions defined therein: a region 3D where a drain is formed, a region 3G where a gate made of polysilicon is formed and a region 3S where a source is formed. Defined in the drain region 3D is a contact region C3 where a contact hole is formed for the connection to a signal line there. This contact region C3 is recognized as an interconnection point (i.e., output terminal X) in automatic interconnection. Defined in the source region 3S is a contact region C4 where a contact hole is formed for the connection to the power line 104.

The first interconnection forming area 4 is defined by the cell data as an area for laying out a signal line. The first interconnection forming area 4 includes an interconnection region L1 defined therein. This interconnection region L1 is formed from a layer common to the gate regions 2G and 3G of the transistor forming areas 2 and 3, and allows the gate regions 2G and 3G to be connected together by a polysilicon wire. Defined in the center of the interconnection region L1 is a contact region C5 where a contact hole is formed, for connection of a signal line. This contact region C5 is recognized as an interconnection point (i.e., input terminal A) in automatic interconnection. An interconnection region L2 (hatched portion) for connecting the drain regions 2D and 3D by an aluminum wire is defined over the first interconnection forming area 4 and the transistor forming areas 2 and 3.

The second interconnection forming area 5 is defined by the cell data as an area for laying out the power line 103 and a signal line. The second interconnection forming area 5 includes two terminals 8 and 9, that make up the first terminal region, formed in the same layer as the gate region 2G of the first transistor forming area 2. The terminal regions 8 and 9 serve to form polysilicon terminals. The terminal regions 8 and 9 are located separate from the gate region 2G on a line extending from the gate region 2G, and are to be connected to the gate region 2G by polysilicon wires. The terminals 8 and 9 are recognized as interconnection points (i.e., input terminal A) in automatic interconnection.

The third interconnection forming area 6 is defined by the cell data as an area for laying out the power line 104 and a signal line. The third interconnection forming area 6 includes two terminals 10 and 11, that make up the second terminal region, formed in the same layer as the gate region 3G of the second transistor forming area 3. The terminal regions 10 and 11 serve to form polysilicon terminals. The terminal regions 10 and 11 are located separate from the gate region 3G on a line extending from the gate region 3G, and are to be connected to the gate region 3G by polysilicon wires. The terminal regions 10 and 11 are recognized as interconnection points (i.e., input terminal A) in automatic interconnection.

Cells registered in the cell library are each provided with text data that indicates that a particular region is an input terminal A and/or an output terminal X interconnection point, on the display. For this invertor cell data, text for displaying the input terminal A is provided for the terminal regions 8 to 11 and text for displaying the output terminal X is provided for the contact regions C1 and C3.

When the cell 1 is laid out on the chip using this CAD apparatus, the automatic interconnection program computes the on-chip coordinates of each of the terminal regions 8 to 11 that provide the input terminal A based on data of cell 1 and the layout position of cell 1 on the chip. The automatic interconnection program selects one of the regions 8 to 11 as candidates for the input terminal A, recognizes the selected region as a node (i.e., input terminal A), and lays out a signal line on the selected region. Likewise, the automatic interconnection program computes the on-chip coordinates of each of the contact regions C1 and C3 that provide the output terminal X. The automatic interconnection programs elects one of the regions C1 and C3 as candidates for the output terminal X, recognizes the selected region as a node (i.e., output terminal X), and lays out a signal line on the selected region.

Figure 6:
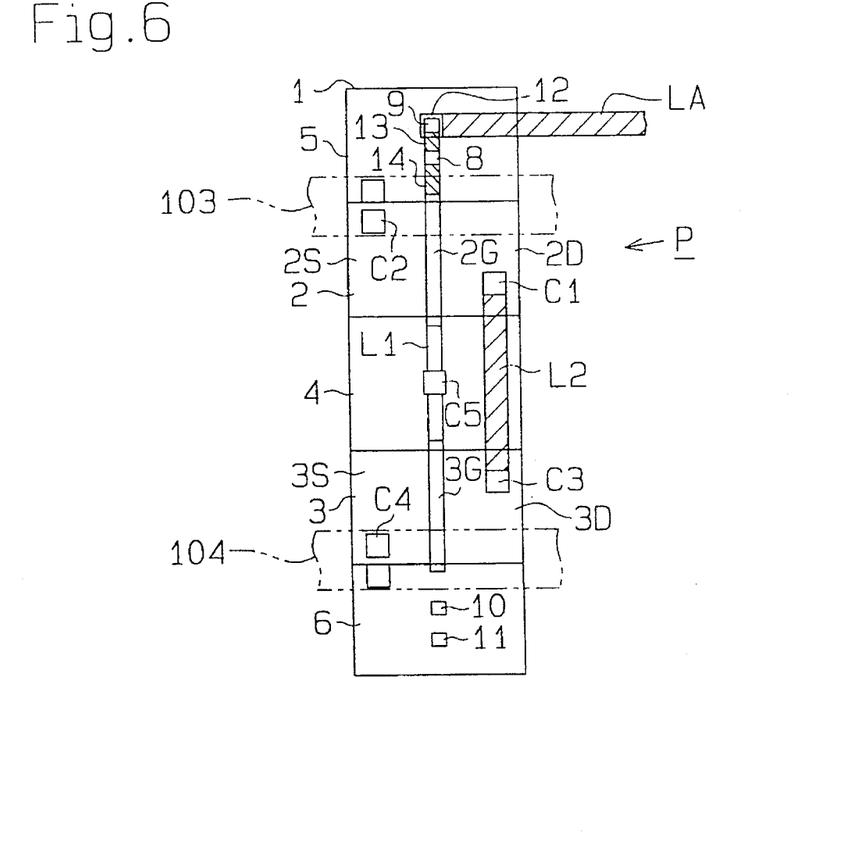
FIG. 6 is an explanatory diagram for explaining the connection of an aluminum interconnection to the invertor cell.

Assuming that the terminal region 9 is selected as the input terminal A in automatic interconnection mode, then the CAD apparatus defines a new contact region 12 on the terminal region 9, where a contact hole is to be formed, as shown in FIG. 6. Then, the CAD apparatus lays out an aluminum wire LA as a signal line on the contact region 12 through automatic interconnection. The CAD apparatus also newly defines an interconnection region 13 for connecting the terminal regions 8 and 9 by a polysilicon wire and an interconnection region 14 for connecting the terminal region 8 and the gate region 2G by a polysilicon wire. Therefore, the aluminum wire LA is connected to the gate region 2G via the regions 12, 9, 13, 8 and 14.

According to this automatic interconnection process, the remaining terminal regions 10 and 11 are not connected to the underlying gate region 3G. Therefore when fabricated, unnecessary polysilicon wire is not added to the gate of the NMOS transistor 102, which is formed in the gate region 3G. Thus additional resistance and capacitance is not added to the aluminum wire LA in the chip that would result in degraded operational characteristics of the transistors 101 and 102 in the form of operational delays.

Figure 7:
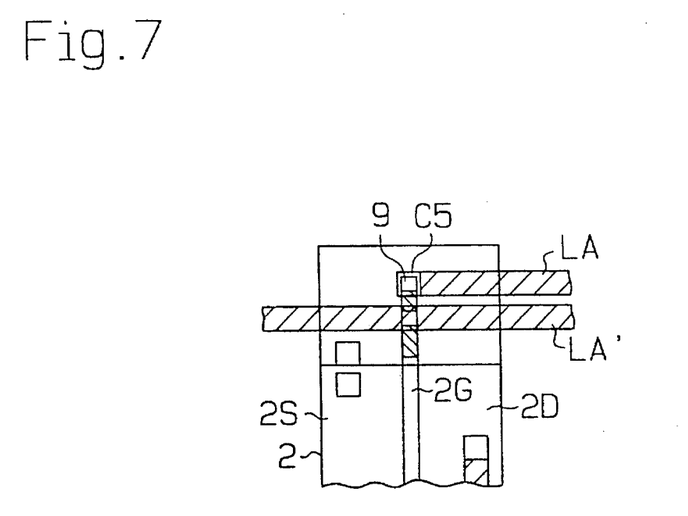
FIG. 7 is a diagram that illustrates the connection of an aluminum interconnection to the invertor cell.

Although the contact region 12 is newly defined on the terminal region 9, no contact regions for forming a contact hole are formed on the remaining terminal regions 8, 10 and 11. Therefore, an aluminum wire LA' for the connection to another cell can be laid out on the remaining terminal regions 8, 10 and 11, as shown in FIG. 7. This improves the interconnecting efficiency on the chip (the number of wires per unit area).

Figure 8:
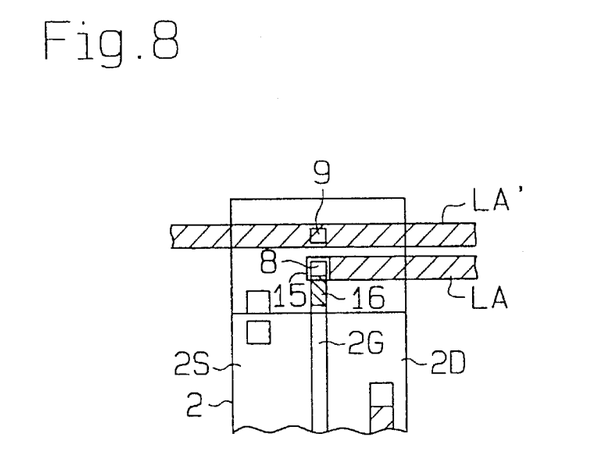
FIG. 8 is a diagram that illustrates the connection of an aluminum interconnection to the invertor cell.

Assuming that the terminal region 8 is selected as the input terminal A in automatic interconnection mode, then the CAD apparatus defines a new contact region 15 on the terminal region 8, where a contact hole is to be formed, as shown in FIG. 8. Then, the CAD apparatus lays out an aluminum wire LA as a signal line on the contact region 15 through automatic interconnection. The CAD apparatus also newly defines an interconnection region 16 for connecting the terminal region 8 and the gate region 2G by a polysilicon wire. Therefore, the aluminum wire LA is connected to the gate region 2G via the regions 15, 8 and 16.

At this time, a region for a polysilicon interconnection is not formed between the terminal regions 9 and 8. No polysilicon interconnection regions are formed between the terminal regions 10 and 11 and the gate region 3G. At this time, the center contact region C5 is removed from the invertor cell data placed on the chip being designed, and is therefore not formed in the fabricated semiconductor chip.

Therefore, unnecessary polysilicon wires are not added to the gates of the transistors 101 and 102. Accordingly, the fabricated semiconductor device does contain the unnecessary interconnections. Thus additional resistance and capacitance is not added to the aluminum wire LA in the chip that would result in degraded operational characteristics of the transistors 101 and 102 in the form of operational delays.

Since no contact region for forming a contact hole is formed on the terminal region 9, an aluminum wire LA' for the connection to another cell can be laid out on the terminal region 9, as shown in FIG. 8, thereby improving the interconnecting efficiency. In addition, the contact region C5 for forming a contact hole is not formed on the interconnection region L1, so that interconnecting efficiency on the chip is likewise improved.

Figure 9:
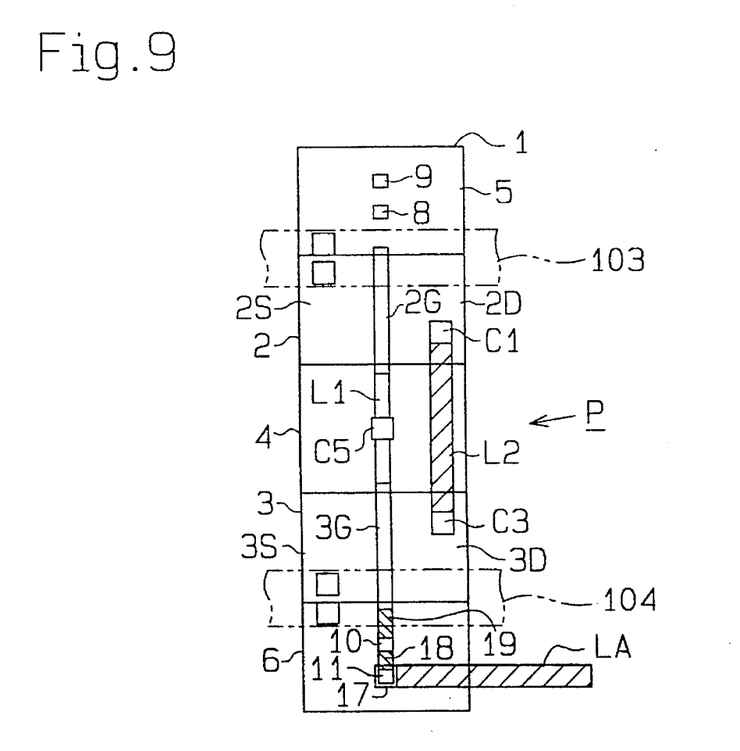
FIG. 9 is a diagram that illustrates the connection of an aluminum interconnection to the invertor cell.

Further, assuming that the terminal region 11 is selected as the input terminal A, then the CAD apparatus defines a new contact region 17 on the terminal region 11, where a contact hole is to be formed, as shown in FIG. 9. Then, the CAD apparatus lays out an aluminum wire LA as a signal line on the contact region 17 through automatic interconnection. The CAD apparatus also newly defines an interconnection region 18 for connecting the terminal regions 10 and 11 by a polysilicon wire and an interconnection region 19 for connecting the terminal region 10 and the gate region 3G by a polysilicon wire. Therefore, the aluminum wire LA is connected to the gate region 3G via the regions 17, 11, 18, 10 and 19. At this time, the contact region C5 is erased from the chip design data and will not be formed on the actual chip.

In automatic interconnection mode, the overlying terminal regions 8 and 9 are not connected to the gate region 2G. Therefore, no unnecessary polysilicon wire is added to the gate of the PMOS transistor 101, which is formed in the gate region 2G. Accordingly, a fabricated semiconductor device does not contain unnecessary interconnections. Thus additional resistance and capacitance is not added to the aluminum wire LA in the chip that would result in degraded operational characteristics of the transistors 101 and 102 in the form of operational delays.

Although the contact region 17 for forming a contact hole is newly defined on the terminal region 11, no contact regions are formed on the remaining terminal regions 8 to 10. Therefore, the aluminum wire LA for the connection to another cell can be laid out on the remaining terminal regions 8 to 10, thus ensuring improved interconnecting efficiency. Further, the contact region C5 for forming a contact hole is not formed on the interconnection region L1. This likewise improves the interconnecting efficiency on the chip.

In the embodiment as described above, the invertor cell 1 has four terminal regions 8 to 11 that become the input terminal A. The terminal regions 8 to 11 are arranged apart from one another and also apart from the gate regions 2G and 3G where the gates of the transistors 101 and 102 are formed. In automatic interconnection mode, a region for forming a contact hole is newly defined on the terminal region selected as the input terminal A. An interconnection region is newly defined between the selected terminal region and the gate region closest to the selected terminal region to connect those two regions by a polysilicon wire.

In the automatic interconnection process, therefore, only the necessary interconnections are designed and unnecessary interconnections are not added to the signal lines. Naturally, redundant interconnections is minimized in a semiconductor device that is fabricated based on the layout data produced through the automatic interconnection process in the CAD apparatus.

According to this embodiment, no region for forming a contact hole is defined on other regions than the terminal region selected as the input terminal A. This allows a region for another signal or power line to be defined on the unselected terminal regions, thus improving interconnecting efficiency on the chip.

Although four terminal regions 8 to 11 are provided in the cell 1 of this embodiment, the number of terminal regions may be increased. Alternatively, the number of the terminal regions may be reduced as needed; for example, only one terminal region 8 may be provided or only two terminal regions 8 and 9 may be provided.

Second Embodiment

A second embodiment of this invention will now be described referring to FIGS. 10 and 11. For the sake of convenience in the description, the same reference numerals as used in cell 1 shown in FIG. 4 will be used to denote the same structures thus their descriptions will be partially omitted.

Figure 10:
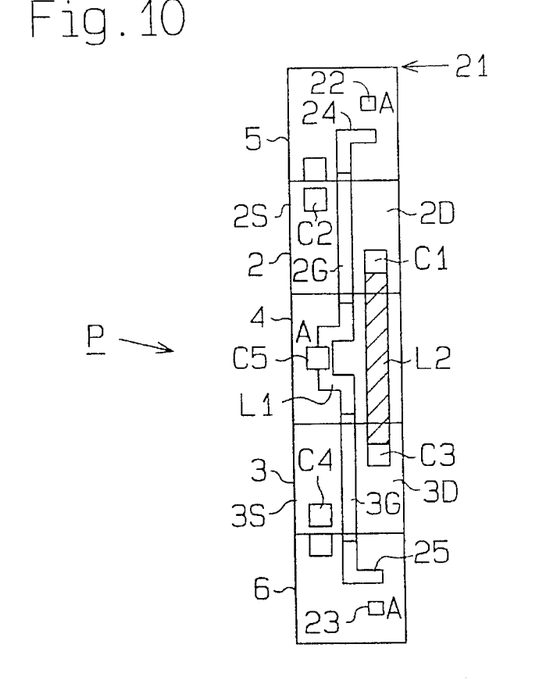
FIG. 10 is a layout diagram for an invertor cell.

FIG. 10 shows a layout pattern P of an invertor cell 21 stored in the cell library. The equivalent circuit of the invertor cell 21 is the same as that of the invertor cell 1 shown in FIG. 4. The pattern P of the cell 21 is displayed on a display 205 based on data of the cell 21, read from the cell library in a memory 202. The pattern P of the cell 21 is narrower than that of the invertor cell 1 shown in FIG. 4.

Many grids (not shown) are displayed at equal intervals in the X and Y axial directions over the entire screen of the display 205 to facilitate computer-aided designing. The width of the cell pattern P in the X direction is smaller by the distance between adjoining grids than that of the pattern P of the cell 1 shown in FIG. 4. In the pattern P of the cell 1 in FIG. 4, regions C2 and C4 are arranged on a first column consisting of grids arranged in the Y direction. Four regions 8 to 11 are defined on the grids in a second grid column adjacent to the first grid column, where the regions C2 and C4 are formed. contact regions C1 and C3 are defined on the grids in a third grid column adjacent to the second grid column, where the regions 8–11 are formed.

Terminal regions 22 and 23 each defined as an input terminal A are respectively formed in regions 5 and 6 in the cell 21. Both terminal regions 22 and 23 are formed on the grids in a grid column to which the contact regions C1 and C3 belong. A center contact region C5 in an interconnection region 4 is formed on the grids in a grid column to which the contact regions C2 and C4 belong. A region L1 connecting two regions 2G and 3G has a crank shape so that it passes the center contact region C5.

Formed in a second interconnection region 5 is an L-shaped region 24, which provides a polysilicon interconnection. This region 24 is connected to the overlying gate region 2G and is separated at a given distance from the terminal region 22. Formed in a third interconnection region 6 is an L-shaped region 25, which provides a polysilicon interconnection. This region 25 is connected to the underlying gate region 3G and is separated at a given distance from the terminal region 23.

Figure 11:
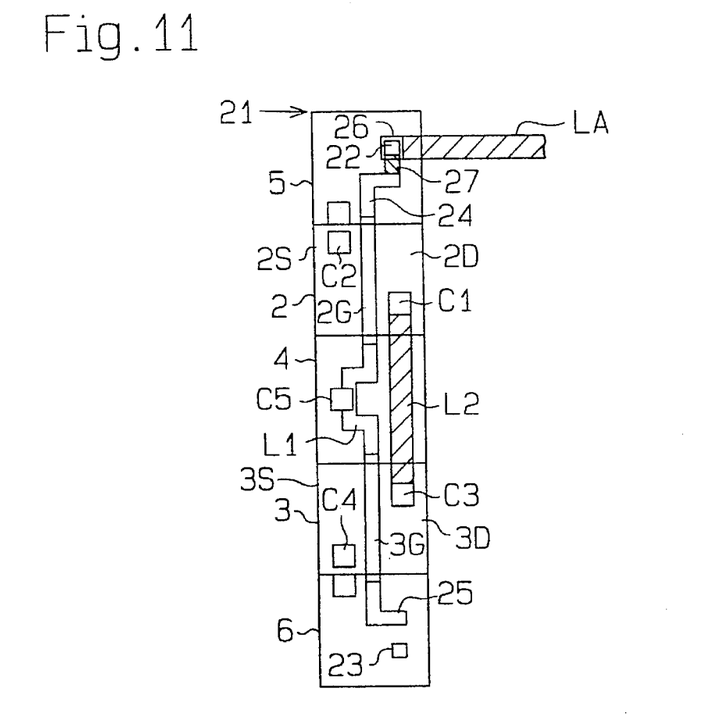
FIG. 11 is a diagram that illustrates the connection of an aluminum interconnection to the invertor cell.

Assuming that the terminal region 22 is selected as the input terminal A in automatic interconnection mode, then the CAD apparatus newly defines a contact region 26 on the terminal region 22, where a contact hole is to be formed, as shown in FIG. 11. Then, the CAD apparatus lays out an aluminum wire LA as a signal line on the contact region 26 through automatic interconnection. The CAD apparatus also newly defines an interconnection region 27 for connecting the terminal region 22 and the region 24 by a polysilicon wire. Therefore, the aluminum wire LA is connected to the gate region 2G via the regions 26, 22, 27 and 24.

In a semiconductor chip fabricated according to this interconnection design, neither a polysilicon interconnection region nor the contact region C5 is formed between the terminal region 23 and the region 25. Although an unnecessary polysilicon interconnection is formed in a portion defined by the region 25 in the gate of the transistor 102, this is significantly shorter than that of the conventional cell 110. This reduces the resistance and capacitance added to the aluminum wire LA.

The location of the terminal regions 22 and 23 on the grids considerably facilitates the connection of the aluminum wire LA (setting of the passage of the aluminum wire LA in the chip) by the automatic interconnection. Further, this cell 21 has a size smaller than the cell 1 shown in FIG. 4. The smaller size increases the packing density of a semiconductor device.

Third Embodiment

A third embodiment of this invention will now be described referring to FIGS. 12 and 13. For the sake of convenience in the description, the same reference numerals as used for cell 1 shown in FIG. 1 will be used to denote the same structures thus their descriptions will be partially omitted.

Figure 12:
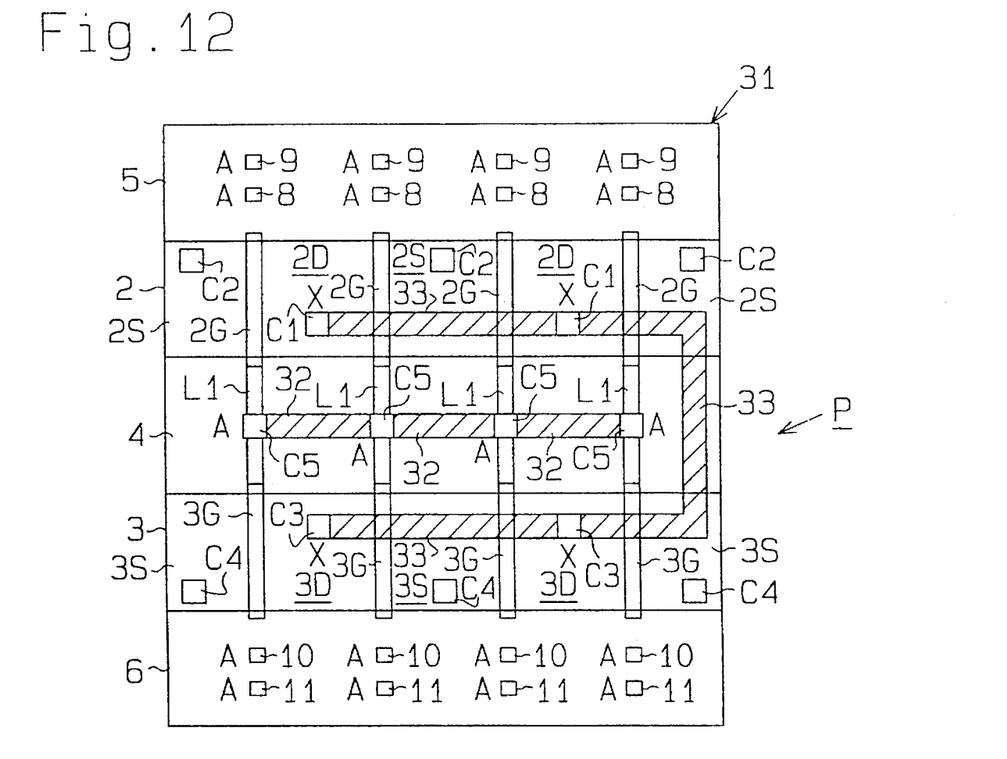
FIG. 12 is a layout diagram for a parallel four-stage invertor cell.
Figure 13:
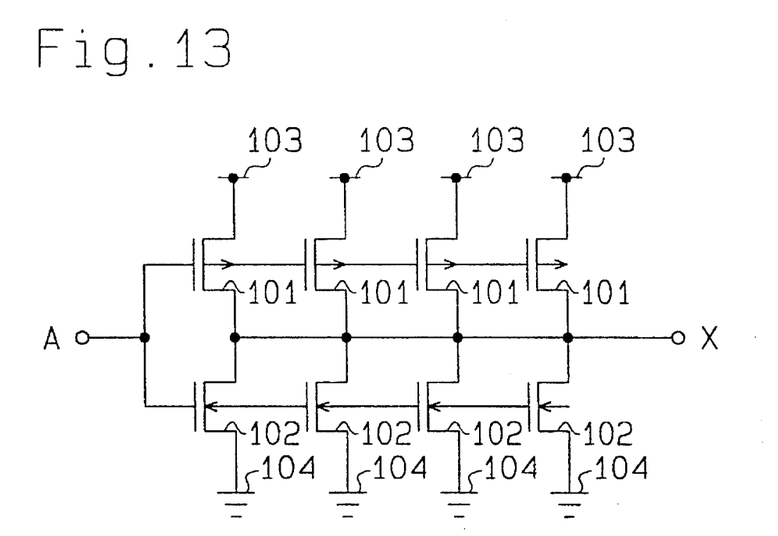
FIG. 13 shows an equivalent circuit of a parallel four-stage invertor cell.

FIG. 12 shows the layout of a parallel four-stage invertor cell 31 stored in the cell library. FIG. 13 shows the equivalent circuit of the cell 31. The cell 31 is equivalent to four invertor cells 1 in FIG. 4 arranged in four stages, and includes four PMOS transistors 101 and four NMOS transistors 102. The pattern P of the cell 31 is displayed on a display 205 based on data of the cell 31 read from the cell library in a memory 202. The area of the pattern P of the cell 31 is four times the area of the pattern P of the invertor cell 31 shown in FIG. 4.

A first transistor forming area 2 is defined as an area where the four PMOS transistors 101 are to be formed. The first transistor forming area 2 includes two regions 2D where drains are formed, four regions 2G where gates made of polysilicon are formed, and three regions 2S where sources are formed. Defined in each drain region 2D is a contact region C1 where a contact hole is formed for the connection to a signal line. Those contact regions C1 are recognized as interconnection points (i.e., output terminal X) in the automatic interconnection process. A contact region C2 where a contact hole is formed for a power line is defined in each source region 2S.

A second transistor forming area 3 is defined as an area where the four NMOS transistors 102 are to be formed. The second transistor forming area 3 includes two regions 3D where drains are formed, four regions 3G where gates made of polysilicon are formed, and three regions 3S where sources are formed. Defined in each drain region 3D is a contact region C3 where a contact hole is formed for the connection to a signal line. Those contact regions C3 are recognized as interconnection points (i.e., output terminal X) in the automatic interconnection process. A contact region C4 where a contact hole is formed for a power line is defined in each source region 3S.

A first interconnection forming area 4 is defined as an area for allowing the layout of signal lines. The first interconnection forming area 4 has four interconnection regions L1 defined therein. The interconnection regions L1 are formed in the same layer as the gate regions 2G and 3G of the transistor forming areas 2 and 3 and connect the associated regions 2G and 3G by polysilicon wires. Defined in each interconnection region L1 is a contact region C5 where a contact hole is formed to provide the connection to a signal line. Those four contact regions C5 are recognized as interconnection points (i.e., input terminal A) in the automatic interconnection process. The first interconnection forming area 4 also has an interconnection region 32 defined therein to connect the adjoining contact regions C5 by an aluminum wire.

A second interconnection forming area 5 is defined as an area for the layout of the power line 103 and signal line. Four inner terminal regions 8 and four outer terminal regions 9 are defined in the second interconnection forming area 5. One inner terminal region 8 and one outer terminal region 9 make a pair, and four pairs of terminal regions 8 and 9 respectively correspond to the four gate regions 2G. The inner and outer terminal regions 8 and 9 are to be connected to the respective gate regions 2G by polysilicon wires, each of which is formed by a part of the polysilicon layer prepared to form each gate region 2G. The inner and outer terminal regions 8 and 9 in each terminal pair are positioned apart from each other on an extension line of the associated gate region 2G. The CAD apparatus recognizes the individual terminal regions 8 and 9 as interconnection points (i.e., input terminal A) in the automatic interconnection process.

A third interconnection forming area 6 is defined as an area for allowing the layout of the power line 104 and signal line. Four inner terminal regions 10 and four outer terminal regions 11 are defined in the third interconnection forming area 6. One inner terminal region 10 and one outer terminal region 11 make a pair, and four pairs of terminal regions 10 and 11 respectively correspond to the four gate regions 3G. The inner and outer terminal regions 10 and 11 are to be connected to the respective gate regions 3G by polysilicon wires, each of which is formed by a part of the polysilicon layer prepared to form each gate region 3G. The inner and outer terminal regions 10 and 11 in each terminal pair are positioned apart from each other on an extension line of the associated gate region 3G. The CAD apparatus recognizes the individual terminal regions 10 and 11 as interconnection points (i.e., input terminal A) in the automatic interconnection process.

An interconnection region 33 is defined in the cell 31 to connect all the contact holes, formed in the contact regions C1 of the individual drain regions 2D and the contact regions C3 of the individual drain regions 3D, by aluminum wires.

When one of the sixteen terminal regions 8 to 11 is selected in the automatic interconnection process, a region where a contact hole is formed for the selected terminal region is newly defined. Further, newly defined only between the selected terminal region and its associated gate region is an interconnection region for connecting both regions. When a semiconductor device is fabricated according to the chip design of this embodiment, only necessary interconnections are formed on this semiconductor chip and unnecessary interconnections are not added to the signal lines. Further, no region for forming a contact hole is defined on the regions that are not selected as the input terminal A. This allows a region for another signal line or power line to be defined on those unselected terminal regions, thus improving the interconnecting efficiency of the chip.

Fourth Embodiment

A fourth embodiment of this invention will now be described referring to FIGS. 14 and 15. For the sake of convenience in the description, the same reference numerals as used for cell 1 shown in FIG. 4 will be used to denote the same structures thus their descriptions will be partially omitted.

Figure 14:
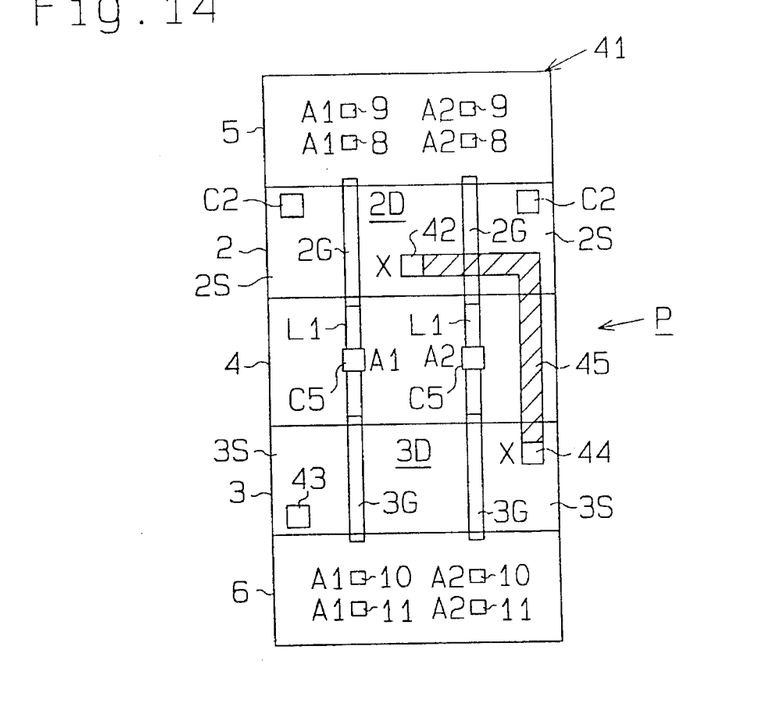
FIG. 14 is a layout diagram for a two-input NAND cell.
Figure 15:
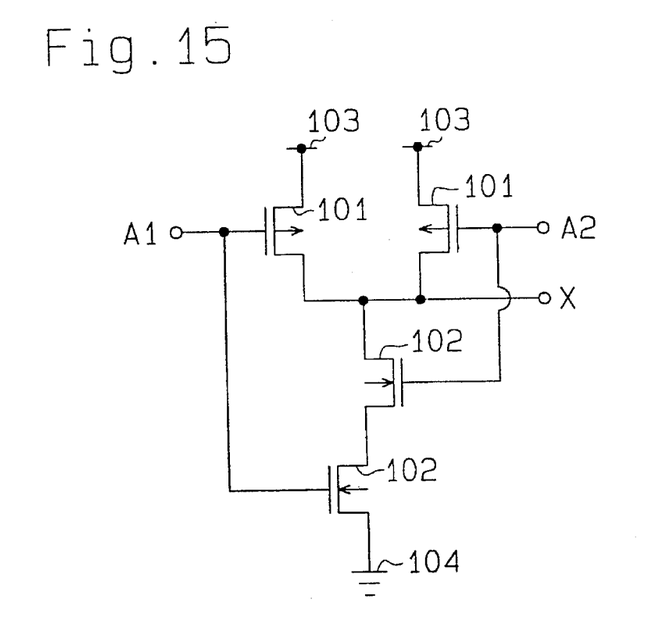
FIG. 15 shows an equivalent circuit of the two-input NAND cell.

FIG. 14 shows a layout pattern P of a 2-input NAND cell 41 stored in the cell library. FIG. 15 shows the equivalent circuit of the cell 41. The cell 41 is equivalent to two invertor cells 1 in FIG. 4 connected, and includes two PMOS transistors 101 and two NMOS transistors 102. The pattern P of the cell 41 is displayed on a display 205 based on data of the cell 41 read from the cell library in a memory 202. The area of the pattern P of the cell 41 is double the area of the pattern P of the invertor cell 1 shown in FIG. 4.

A first transistor forming area 2 is defined as an area where the two PMOS transistors 101 are to be formed. The first transistor forming area 2 includes a region 2D where a common drain is formed, two regions 2G where gates made of polysilicon are formed, and two regions 2S where sources are formed. Defined in the common drain region 2D is a contact region 42 where a contact hole is formed for the connection to a signal line. The contact region 42 is recognized as an output terminal X in the automatic interconnection process. A contact region C2 where a contact hole is formed for connecting a power line is defined in each source region 2S.

A second transistor forming area 3 is defined as an area where the two NMOS transistors 102 are to be formed. The second transistor forming area 3 includes a region 3D where a common drain is formed, two regions 3G where gates made of polysilicon are formed, and two regions 3S where sources are formed. One of the source regions 3S has a contact region 43 where a contact hole is formed to provide the connection to the power line, while the other source region 3S includes a contact region 44 where a contact hole is formed to provide the connection to the signal line. The contact region 44 is recognized as an output terminal X in the automatic interconnection process.

A first interconnection forming area 4 is defined as an area for allowing the layout of signal lines. The first interconnection forming area 4 has two interconnection regions L1 defined therein. The interconnection regions L1 are formed in the same layer as the gate regions 2G and 3G of the transistor forming areas 2 and 3 and connect the associated regions 2G and 3G by polysilicon wires. Defined in the center of each interconnection region L1 is a contact region C5 where a contact hole is formed to provide the connection to a signal line. Those contact regions C5 are recognized as input terminals A1 and A2 of the equivalent circuit in the automatic interconnection process.

A second interconnection forming area 5 is defined as an area for allowing the layout of the power line and signal line. Two inner terminal regions 8 and two outer terminal regions 9 are defined in the second interconnection forming area 5. One inner terminal region 8 and one outer terminal region 9 make a pair, and two pairs of terminal regions 8 and 9 respectively correspond to the two gate regions 2G. The inner and outer terminal regions 8 and 9 are to be connected to the respective gate regions 2G by polysilicon wires, each of which is formed by a part of the polysilicon layer prepared to form each gate region 2G. The inner and outer terminal regions 8 and 9 in each terminal pair are positioned apart from each other on an extension line of the associated gate region 2G. The CAD apparatus recognizes the individual terminal regions 8 and 9 as interconnection points (i.e., input terminal A) in the automatic interconnection process.

A third interconnection forming area 6 is defined as an area for allowing the layout of the power line and signal line. Two inner terminal regions 10 and two outer terminal regions 11 are defined in the third interconnection forming area 6. One inner terminal region 10 and one outer terminal region 11 make a pair, and two pairs of terminal regions 10 and 11 respectively correspond to the two gate regions 3G. The inner and outer terminal regions 10 and 11 are to be connected to the respective gate regions 3G by polysilicon wires, each of which is formed by a part of the polysilicon layer prepared to form each gate region 3G. The inner and outer terminal regions 10 and 11 in each terminal pair are positioned apart from each other on an extension line of the associated gate region 3G. The CAD apparatus recognizes the individual terminal regions 10 and 11 as interconnection points (i.e., input terminal A) in the automatic interconnection process.

An interconnection region 45 is defined in the cell 41 to connect the contact holes, formed in the contact region 42 and the contact region 44, by an aluminum wire.

When one of the terminal regions 8 to 11 is selected in the automatic interconnection process, a region where a contact hole is formed for the selected terminal region is newly defined. Further, newly defined only between the selected terminal region and its associated gate region is an interconnection region for connecting both regions. When a semiconductor device is fabricated according to the chip design of this embodiment, only necessary interconnections are formed on this semiconductor chip and unnecessary interconnections are not added to the signal lines. Further, no region for forming a contact hole is defined on the regions that are not selected as the input terminals A1 and A2. This allows a region for another signal line or power line to be defined on the unselected terminal regions, thus improving the interconnecting efficiency on the chip.

Although only four embodiments of the present invention have been described herein, it should be apparent to those skilled in the art that the present invention may be embodied in many other specific forms without departing from the spirit or scope of the invention. Particularly, it should be understood that this invention may be adapted for a cell constituted of a bipolar transistor or a cell constituted of a gallium arsenide transistor besides the cells of the above four embodiments. This invention may also be applied to cells that form a gate array.

Therefore, the present examples and embodiments are to be considered as illustrative and not restrictive and the invention is not to be limited to the details given herein, but may be modified within the scope of the appended claims.

What is claimed is:

1. A method for designing a semiconductor device that includes a plurality of circuit elements each having an internal circuit, wherein design data for each circuit element is provided as a cell, the method comprising the steps of:

preparing in advance a cell as design data of a circuit element including a first area in which an internal circuit of said circuit element is defined, and a second area in which a plurality of connecting terminal points to be used for connecting the circuit element to an external interconnection are defined such that the connecting terminal points are electrically disconnected from the internal circuit in said first area;

placing the cell, obtained at said preparation step, at a desired position in the semiconductor device being designed;

selecting one of said plurality of connecting terminal points in said second area; and designing an internal interconnection, within said cell, for connecting the internal circuit in said first area to the selected connecting terminal point in said second area, wherein the remaining connecting terminal points that are not selected at said selection step are left without being used for the connection with said internal circuit.

2. The method according to claim 1, wherein the cell has a second connecting terminal point that is electrically connected to said internal circuit in said first area.

3. The method according to claim 2, wherein the cell defines an invertor formed by combining two transistors, each transistor having a gate, and wherein said second connecting terminal point is formed by contact region connected to the gates of said two transistors.

4. The method according to claim 1, wherein the cell defines an invertor formed by combining two transistors forming the internal circuit of said cell, and wherein one of said plurality of connecting terminal points in said second area is selected for an electrical connection with a gate electrode of one of said two transistors.

5. The method according to claim 4, wherein the invertor defined by said cell consists of PMOS transistor and NMOS transistor, and wherein a layout pattern of said cell comprises:

a first interconnection area;

a second interconnection area;

a third interconnection area;

a PMOS transistor area provided between the first interconnection area and the second interconnection area;

an NMOS transistor area provided between the first interconnection area and the third interconnection area;

an interconnection region provided in said first interconnection area to connect a gate region of the PMOS transistor area and a gate region of the NMOS transistor area;

a first terminal group consisting of a plurality of first terminals which are located in said second interconnection area to be isolated from the gate region of said PMOS transistor area; and a second terminal group consisting of a plurality of second terminals which are located in said third interconnection area to be isolated from the gate region of said NMOS transistor area, said first and second terminals of said first and second terminal groups serving as said plurality of connecting terminal points, the method further comprising the steps of:

selecting one of said first and second terminal groups and subsequently selecting one of the terminals of the selected terminal group; and designing an interconnection region for connecting the selected terminal to a gate region of the transistor area adjacent to the interconnection area in which said selected terminal group is located.

6. The method according to claim 5, further comprising the step of providing a contact region on or above said selected terminal, a contact hole being formed in the contact region to connect the selected terminal to an external interconnection.

7. The method according to claim 1, wherein the cell defines a two-input NAND gate, and wherein one of said plurality of connecting terminal points in said second area is selected for an electrical connection with a gate electrode of one of transistors forming said two-input NAND gate.

* * * * *

UNITED STATES PATENT AND TRADEMARK OFFICE
CERTIFICATE OF CORRECTION

PATENT NO.: 5,566,080
DATED : October 15, 1996
INVENTOR(S): Atsushi YOKOI

It is certified that error appears in the above-identified patent and that said Letters Patent is hereby corrected as shown below:

On the cover page, Item [73], please change from "Fujitsu Limited, Kawasaki, Japan" to --Fujitsu Limited, Kawasaki, Japan and Fujitsu VLSI Limited, Kasugai-shi, Japan--.

Signed and Sealed this

Eleventh Day of March, 1997

Attest:

BRUCE LEHMAN

*Attesting Officer*      *Commissioner of Patents and Trademarks*